| United States Patent [19] | [11] Patent Number: 4,462,862 |
|---|---|
| Kazama et al. | [45] Date of Patent: Jul. 31, 1984 |

[54] METHOD FOR GENERATING SUBSTRATES OF ELECTROPHOTOGRAPHIC PHOTOSENSITIVE MATERIALS

[75] Inventors: Toyoki Kazama, Yokosuka; Michiro Shimatani, Fujisawa, both of Japan

[73] Assignee: Fuji Electric Company, Ltd., Kawasaki, Japan

[21] Appl. No.: 387,219

[22] Filed: Jun. 10, 1982

[30] Foreign Application Priority Data

Jun. 15, 1981 [JP] Japan ................................. 56-91752

[51] Int. Cl.$^3$ ............................ C23F 1/00; B44C 1/22
[52] U.S. Cl. .................................... 156/643; 430/69; 430/128
[58] Field of Search ...................... 430/128, 125, 69; 156/643; 204/192 E

[56] References Cited

U.S. PATENT DOCUMENTS 4,341,592  7/1982  Shortes ................................ 156/643

OTHER PUBLICATIONS

J. Appl. Phys., vol. 20, 1981, #3, 667–668, Toyoda et al., Etching of $SiO_2$.
Iannuzzi, IEEE Transaction, vol. CHMT-4, #4, Dec. 1981, pp. 429–438.

*Primary Examiner*—John E. Kittle
*Assistant Examiner*—John L. Goodrow
*Attorney, Agent, or Firm*—Brumbaugh, Graves, Donohue & Raymond

[57] ABSTRACT

Disclosed is a method for removing an amorphous silicon photosensitive layer from the metallic surface (e.g., aluminum or stainless steel) of a substrate used in electrophotography. The amorphous silicon layer is removed by exposing such layer to a plasma generated in a fluorine-containing atmosphere. Such a plasma provides a high etch rate for the amorphous silicon layer and an extremely high silicon-to-metal etch selectivity. Therefore, the amorphous silicon layer may be rapidly removed by etching at a high power density without risk of damaging the polished metallic surface of the electrophotographic substrate. Moreover, since the etching automatically stops when the metallic surface is reached, no end-point detection is necessary.

3 Claims, 1 Drawing Figure

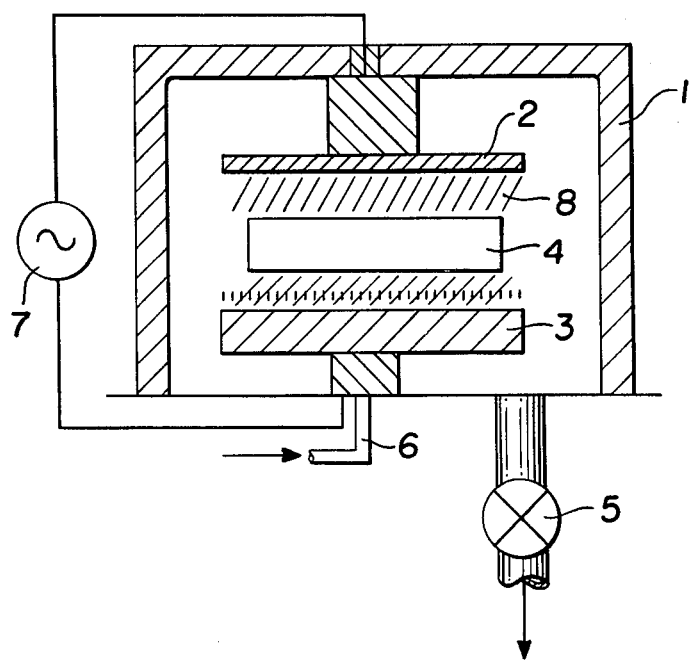

METHOD FOR GENERATING SUBSTRATES OF ELECTROPHOTOGRAPHIC PHOTOSENSITIVE MATERIALS

This invention relates to a method for generating a substrate of an electrophotographic photosensitive material having a photosensitive layer composed of amorphous silicon formed on the conductive substrate.

In an electrophotographic photosensitive material, it is required that a photosensitive layer is uniformly adhered to a substrate and hence an aluminum drum the surface of which has been subjected to mirror plane finishing is usually used as the substrate, which is, thus, expensive. When the photosensitive material is used for a long period of time, the photosensitive layer is consumed and the characteristics of it are degraded, and hence the photosensitive material is renewed. Therefore, it is desired from an economical view point to recover the substrate for reuse. A selenium series amorphous material conventionally used for a photosensitive layer has such thermally weak properties that the crystallizing temperature thereof is low and the vapor pressure is high, a photosensitive layer using the selenium series amorphous material can be separate from the substrate by heating. However, in the case of using amorphous silicon which has excellent heat resistance and durability and is now being watched with keen interest as a material for the photosensitive layer of an electrophotographic photosensitive material, it is difficult to regenerate the substrate without being accompanied by damages by the method based on heating as in the case of separating the foregoing selenium series material since the crystallizing temperature of amorphous silicon is higher than 500° C., which is the basis of the high durability.

SUMMARY OF THE INVENTION

The object of this invention is to provide a method of regenerating a substrate for an electrophotographic photosensitive material capable of removing a photosensitive layer composed of amorphous silicon and recovering the substrate without the occurence of any damages.

The object of this invention can be attained by generating plasma in an atmosphere containing fluorine and gasifying amorphous silicon on a substrate having a metallic layer at least on the surface thereof by reaction to remove it.

This invention is based on the recognition that the dry etching technique of single crystal or polycrystal silicon, $Si_3N_4$, or $SiO_2$ used in the production of silicon integrated circuits can be very effectively applied to the regeneration and recovery of a metallic substrate for amorphous silcon photosensitive material.

BRIEF DESCRIPTION OF THE DRAWING

The sole FIGURE of the drawing is a schematic view showing an example of the apparatus used for practicing the present invention.

DETAILED DESCRIPTION

The example of this invention is explained by referring to the accompanying drawing. In the FIGURE, discharging electrodes 2 and 3 are disposed in a vacuum vessel 1 and between both the electrodes 2 and 3 is supported an electrophotographic photosensitive material 4 by a supporting means (not shown). The photosensitive material 4 is composed of, for example, an aluminum cylindrical substrate having formed thereon an amorphous silicon photosensitive layer. After evacuating the vessel 1 through a valve 5, a carbon tetrafluoride gas and oxygen are introduced into the vessel through a gas inlet pipe 6 until the pressure becomes about 1-5 Torr. In this case, the concentration of oxygen is, for example, 5%. Then, a high frequency electric potential of, for example, 13.56 MHz is applied between the discharging electrodes 2 and 3 by a power supply source 7 to generate plasma 8. When the photosensitive material is maintained in this state for a definite time, volatile $SiF_4$ is formed and amorphous silicon on the substrate 4 is completely removed.

The most excellent merit of this method is in the point that the substrate of photosensitive material composed of aluminum or austenite stainless steel is scarcely damaged. This is because silicon is gasified by the action with fluorine and scattered away, while the substrate metal is not gasified. Thus, since etching does not proceed into the substrate as the case of applying sputtering and when the amorphous silicon layer is removed, the reaction stops automatically, and the substrate is not injured.

Another merit of the method is the point that the method is very practical on the photosensitive material in regard to etching speed. That is, dry etching in an integrated circuit producing technique is performed at a low electric power of about 0.05 watt/cm$^2$ considering the resistance of side etching of photoresist, while in the method of this invention, such a consideration is unnecessary and an etching speed of 1 $\mu$m/min which is several times faster than that of ordinary dry etching is easily attained by only increasing the high frequency electric power. The thickness of the amorphous silicon layer as the photosensitive layer is from 3 $\mu$m to several tens $\mu$m, which is thicker than an amorphous silicon layer for, for example, a solar cell, and hence it is advantageous in the efficiency of the regeneration treatment that the etching speed can be increased.

As stated above, according to this invention, an amorphous silicon photosensitive layer which cannot be removed from a substrate by a heating method is removed from the substrate by utilizing plasma etching which is used in the technique of producing integrated circuits and since the substrate can be regenerated and recovered without damages or injuries, the economical effect of this invention is very high.

The substrate treated in the method of this invention is not limited to a cylindrical one but a plate-like substrate may be used in this invention. In regard to the material for the substrate, the method of this invention can be applied not only to aluminum or non-magnetic stainless steel usually used as a substrate for electrophotographic photosensitive materials but also to a substrate composed of an insulating material having formed thereon a metallic conductive layer.

We claim:

1. A method for regenerating the substrate of an electrophotographic photosensitive element which includes an amorphous silicon layer coated on a metal surface to provide a clean metal substrate for reuse in a photosensitive element comprising providing an atmosphere containing fluorine at reduced pressure in contact with the amorphous silicon layer, generating a plasma in the fluorine-containing atmosphere, reacting the plasma with the amorphous silicon layer to produce a gaseous silicon compound, and maintaining the plasma in contact with the surface of the element until all of the amorphous silicon has been removed.

2. A method according to claim 1 wherein the fluorine-containing atmosphere contains carbon tetrafluoride and oxygen.

3. A method according to claim 1 or claim 2 wherein the metal substrate is aluminum.

* * * * *